(12) United States Patent
Kuo et al.

(10) Patent No.: US 9,275,950 B2
(45) Date of Patent: Mar. 1, 2016

(54) BEAD FOR 2.5D/3D CHIP PACKAGING APPLICATION

(75) Inventors: Feng Wei Kuo, Zhudong Township (TW); Huan-Neng Chen, Taichung (TW); Chewn-Pu Jou, Chutung (TW); Der-Chyang Yeh, Hsin-Chu (TW); Chuei-Tang Wang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 820 days.

(21) Appl. No.: 13/481,974

(22) Filed: May 29, 2012

(65) Prior Publication Data

US 2013/0320553 A1    Dec. 5, 2013

(51) Int. Cl.
*H01L 23/528* (2006.01)
*H01L 23/552* (2006.01)
*H01L 23/522* (2006.01)

(52) U.S. Cl.
CPC ............ *H01L 23/528* (2013.01); *H01L 23/552* (2013.01); *H01L 23/5227* (2013.01); *H01L 2223/6616* (2013.01); *H01L 2224/04105* (2013.01); *H01L 2224/24137* (2013.01); *H01L 2924/14* (2013.01); *H01L 2924/15311* (2013.01); *H01L 2924/18162* (2013.01)

(58) Field of Classification Search
CPC ........................... H01L 23/528; H01L 23/552
See application file for complete search history.

(56) References Cited

U.S. PATENT DOCUMENTS

| 4,758,808 | A | 7/1988 | Sasaki et al. |
| 6,028,353 | A | 2/2000 | Nakano et al. |
| 6,264,476 | B1 * | 7/2001 | Li et al. ............ 439/66 |
| 2005/0046521 | A1 | 3/2005 | Komiya |

FOREIGN PATENT DOCUMENTS

| CN | 1681119 A | 10/2005 |
| CN | 1316617 C | 5/2007 |

OTHER PUBLICATIONS

Official Action issued Jan. 16, 2015 in counterpart Taiwan patent application.

* cited by examiner

*Primary Examiner* — Jose R Diaz
(74) *Attorney, Agent, or Firm* — Duane Morris LLP (57) ABSTRACT

An integrated circuit package having a multilayer interposer has one or more metal wiring beads provided in the interposer, each of the one or more metal wiring beads has a convoluted wiring pattern that is formed in one of the multiple layers of wiring structures in the interposer, and two terminal end segments connected to the power lines in the integrated circuit package, wherein the one or more metal wiring beads operate as power noise filters.

17 Claims, 14 Drawing Sheets

$Z = X_L + R_s$
$X_L = jWL_s$
$WL_s = WL_0 u'_s$
$R_s = WL_0 u''_s$

FIG. 12A $\tan \theta = \dfrac{R_s}{WL_s} = \dfrac{u'_s}{u''_s}$ $L_o = \dfrac{4\pi V^2 \cdot 10^{-9}}{C_1}$ $L_o$ : core inductance $C_1$ : Core factor

FIG. 12B

BEAD FOR 2.5D/3D CHIP PACKAGING APPLICATION

FIELD

The present disclosure generally relates to a bead element employed in integrated circuit packaging and in particular, to a multilayer interposer structure for 2.5D/3D applications that eliminates different power noise and suppress electromagnetic interference.

BACKGROUND

The present invention relates to an impedance element, in particular, relates to such an element which is used as a bead filter or a noise filter to eliminate power noise and suppress electromagnetic interference in integrated circuit (IC) devices.

BRIEF DESCRIPTION OF THE DRAWINGS

All drawings are schematic and are not to scale.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Disclosed herein is a method for eliminating different power noise and suppressing electromagnetic interference (EMI) in 2.5D/3D integrated circuit (IC) packages used in communication system applications. According to an embodiment, one or more convoluted metal wiring beads having a convoluted shape are incorporated into the wiring structures of the multilayer interposer of a 2.5D/3D IC package. The convoluted metal wiring bead can be incorporated into the power lines in the IC package and function as a bead filter or a noise filter to eliminate power line noise. The metal wiring bead is configured to provide an appropriate impedance to meet the power noise reduction requirement of a particular IC package's requirement. Unlike many conventional impedance elements that are implemented as ferrite beads or discrete surface-mount devices such as ferromagnetic insulation chips, incorporating the impedance element into the multilayer interposer structure provides more compact solution and lower cost.

Figure 1:
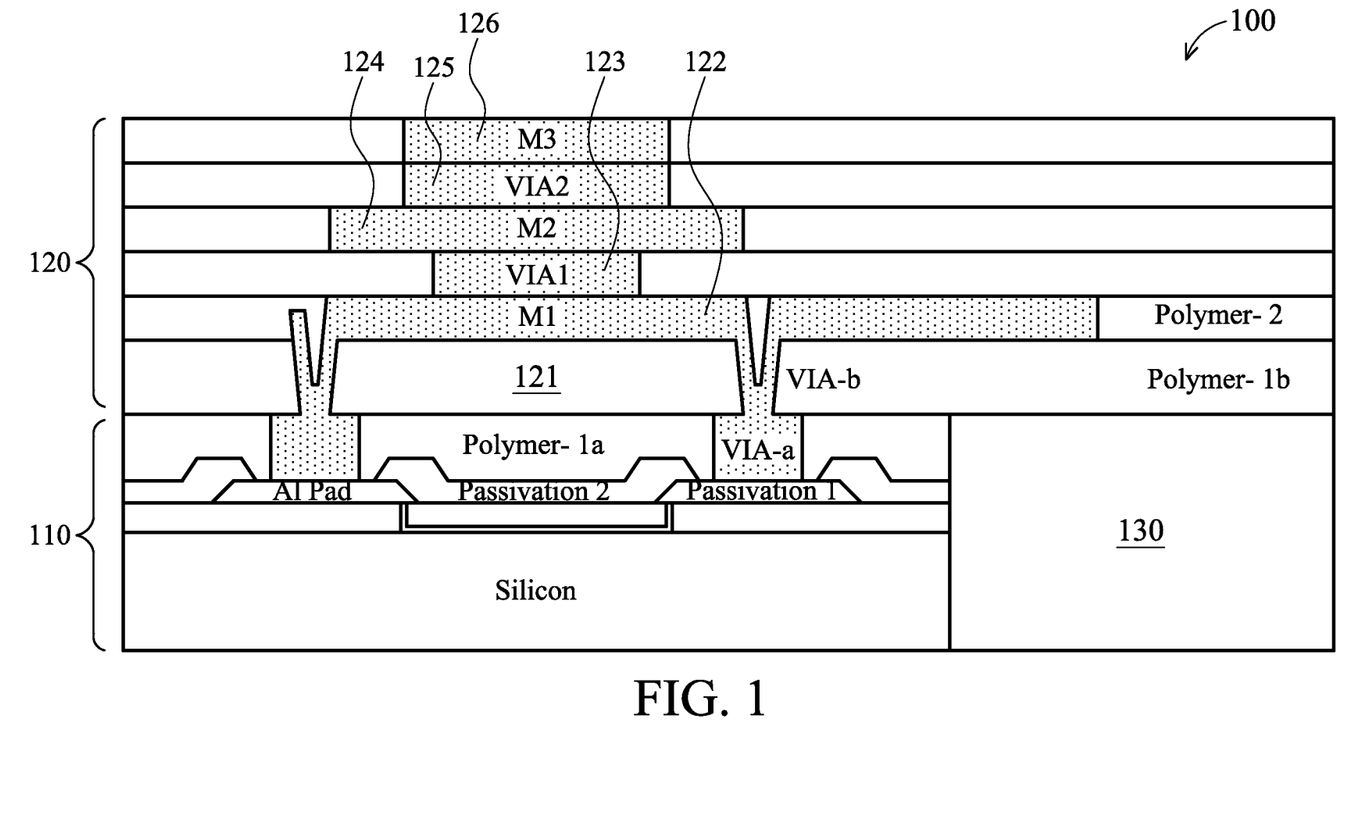
FIG. 1 is a cross-sectional view illustration of a portion of a 2.5D/3D IC Package in which one or more of the metal wiring bead of the present disclosure can be incorporated.

FIG. 1 is a cross-sectional view illustration of a portion of a 2.5D/3D IC package 100 in which one or more of the metal wiring bead of the present disclosure can be incorporated. The IC package 100 comprises an IC device 110 and an interposer 120 attached to the IC device. Generally, the IC device 110 can be encapsulated with a molding compound 130.

The interposer 120 comprises a multiple layers of wiring structures. In this example interposer 120, the multiple layers of wiring structures comprise a plurality of wiring layers 122, 124, and 126 and via layers 121, 123 and 125. The wiring layers 122, 124, and 126 each comprises various wiring structures formed from conductor materials M1, M2, M3, corresponding to the wiring layers 122, 124, 126 respectively, disposed in a dielectric material. The via layers 121, 123 and 125 each comprises a plurality of vias generally referred to herein as V1, V2, V3, respectively, disposed in a non-ferrite polymeric dielectric material. The vias provide the electrical connection between the wiring layers. The vias V1 in the first via layer 121 provide the electrical connection between the wiring structures of the first wiring layer 122 and the IC device 110. Generally, the conductor materials M1, M2, M3 are copper-based metal and the dielectric material is one or more types of polymers. The conductor materials M1, M2, and M3 generally are the same materials but they can be different.

According to an embodiment of the present disclosure, the metal wiring bead is provided in the interposer 120 of the IC package 100. The metal wiring bead can comprise a single layer pattern, a two-layer pattern or a three-layer pattern and can be formed in one or more of the plurality of metal wiring layers 122, 124, and 126.

Figure 2:
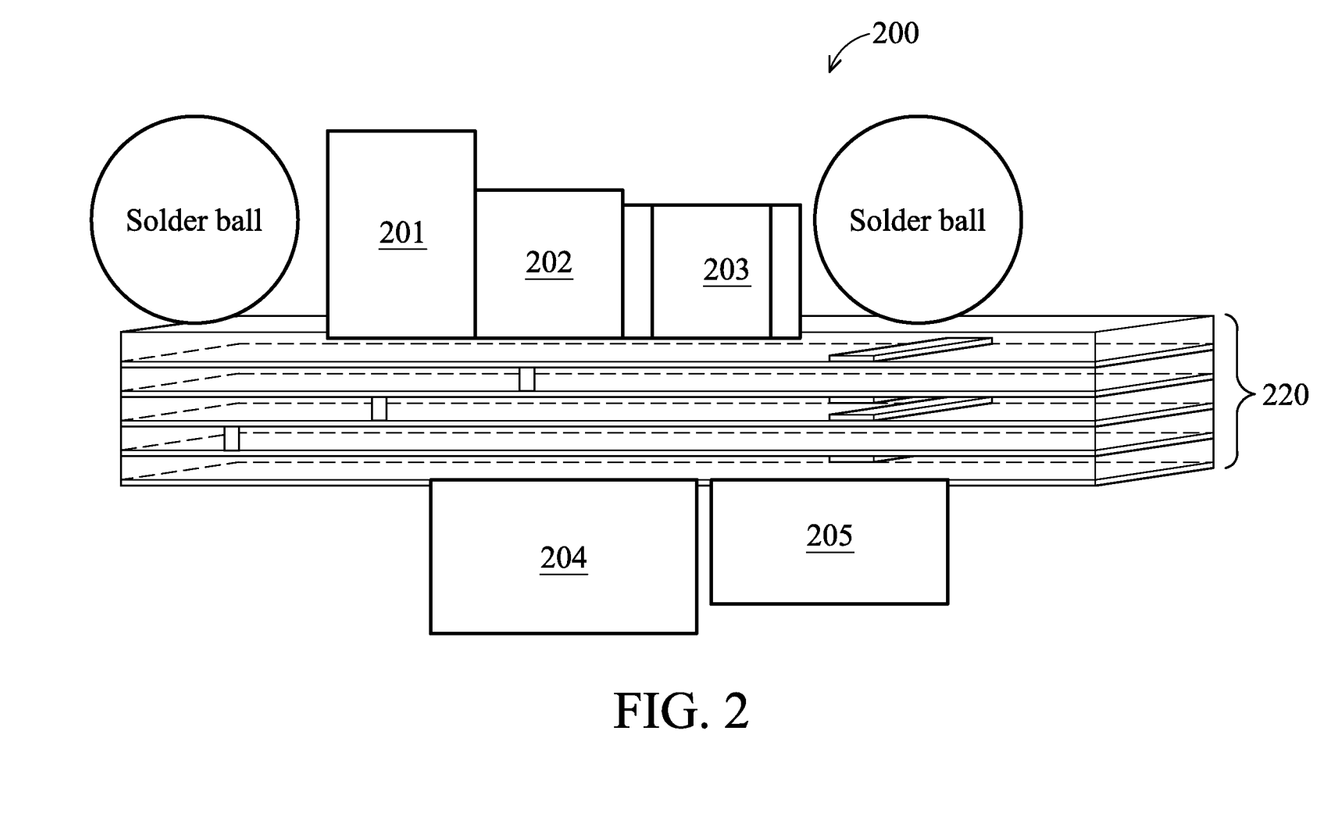
FIG. 2 is an illustration of an example of a 2.5D IC package in which one or more of the metal wiring bead of the present disclosure can be incorporated.

FIG. 2 is a schematic illustration of an example of a 2.5D IC package 200 in which one or more of the metal wiring bead of the present disclosure can be incorporated. The IC package 200 comprises an interposer 220 to which one or more IC devices 201, 202, and 203 are attached on one side and one or more IC devices 204 and 205 are attached on the second side. One or more of the metal wiring bead of the present disclosure can be incorporated in the interposer 220.

Figure 3:
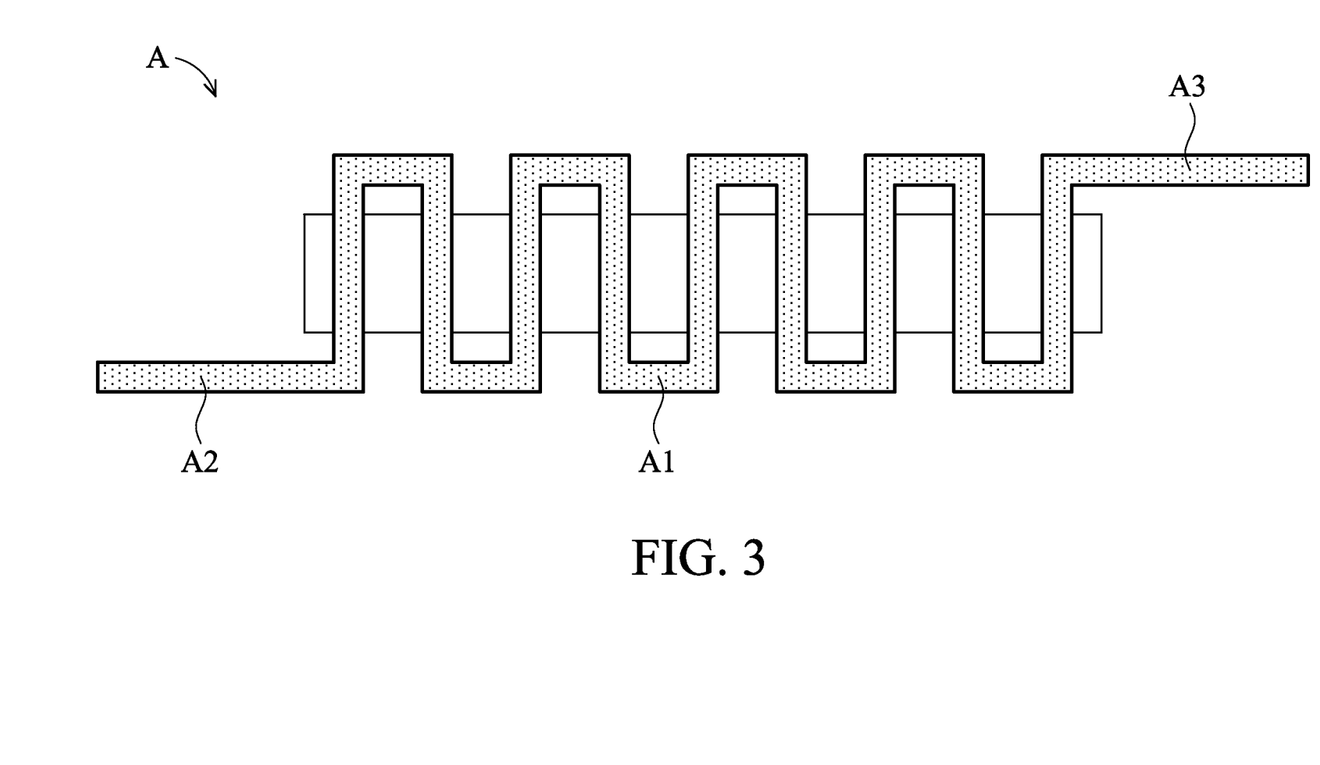
FIG. 3 shows a one-layer metal wiring bead according to an embodiment.

FIG. 3 shows a one-layer embodiment of a metal wiring bead A according to an aspect of the present disclosure. The metal wiring bead A has a convoluted wiring pattern that is formed in one of the three wiring layers 122, 124 or 126 from the corresponding M1, M2 or M3 conducting material. The convoluted wiring pattern of the metal wiring bead A has a serpentine-like portion A1 that begins at first terminal segment A2 and ends at a second terminal segment A3. The serpentine-like portion A1 is a wiring trace of the conductor material provided in a meandering serpentine-like pattern. The two terminal segments A2 and A3 provide electrical connection to the functional power lines in the IC package. The term "serpentine-like" is used to describe the generally winding shape represented by the portion A1 where the metal wiring is winding back and forth similar to the shape formed by the body of a moving serpent.

Figure 4:
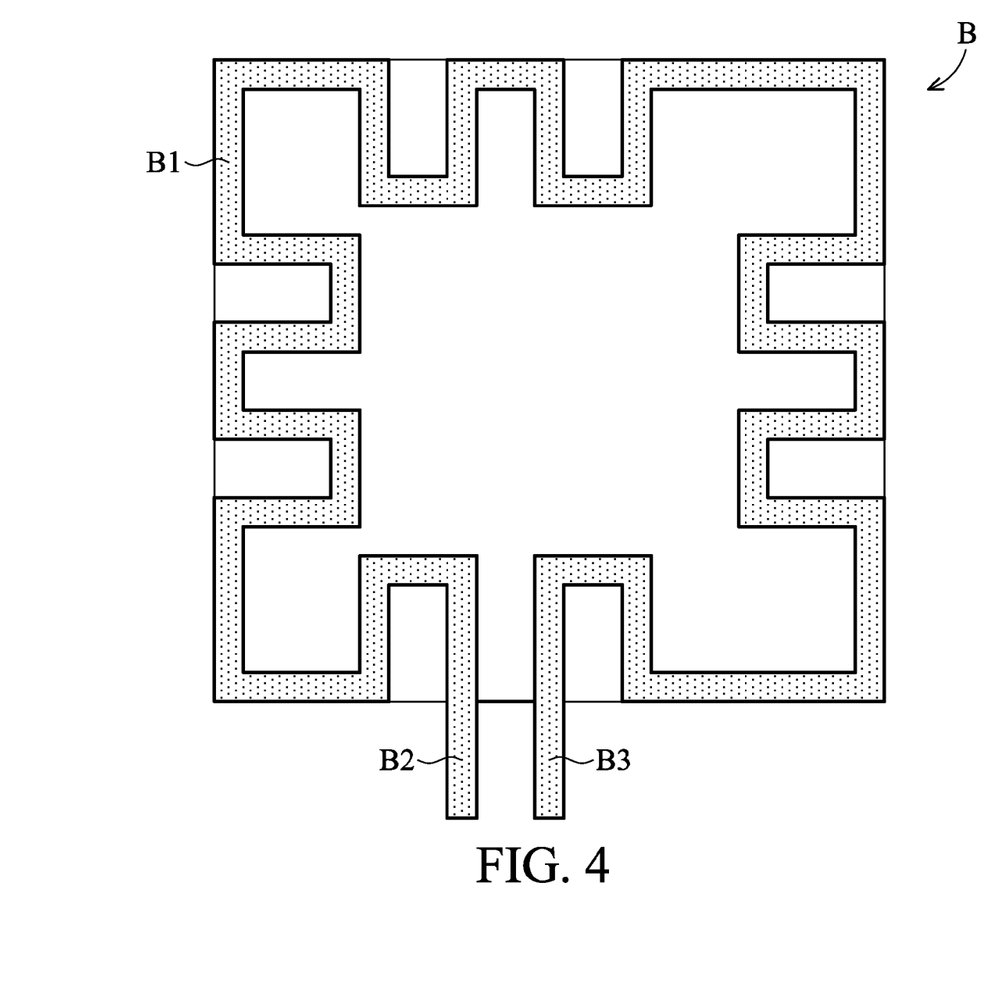
FIG. 4 shows a one-layer metal wiring bead according to another embodiment

FIG. 4 shows another one-layer embodiment of a metal wiring bead B. The metal wiring bead B has a convoluted wiring pattern that is formed in one of the three wiring layers 122, 124 or 126 from the corresponding M1, M2 or M3 conducting material. Unlike the metal wiring bead A shown in FIG. 3, the convoluted wiring pattern of the metal wiring bead B has a meandering loop portion B1 that begins at a first terminal segment B2, follows a square or quadrilateral outline and loops back towards the first terminal segment and ends at a second terminal segment B3. The conductive line tracing in the meandering loop portion B1 meanders in right angles, but the meandering pattern of the conductive line trace can be in any shape. The two terminal segments B2 and B3 are connected to the functional power lines in the IC package.

Figure 5A:
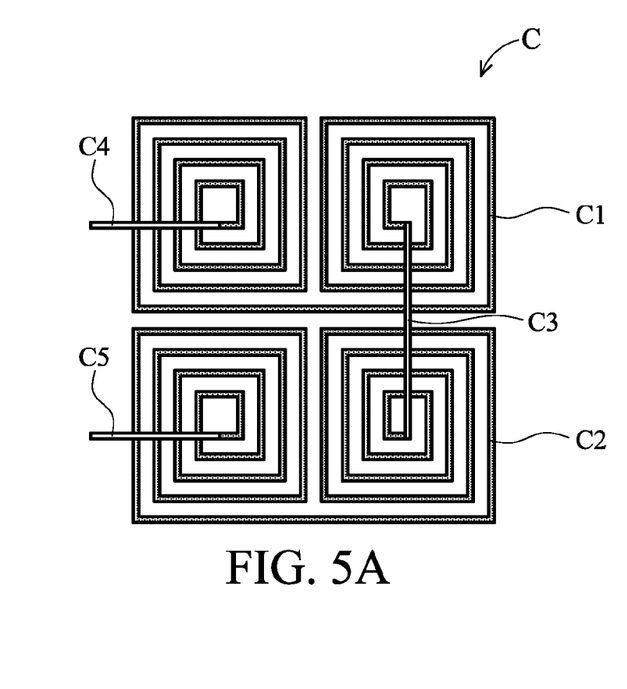
FIGS. 5A and 5B show two-layer metal wiring beads embodiments according to another embodiment.
Figure 5B:
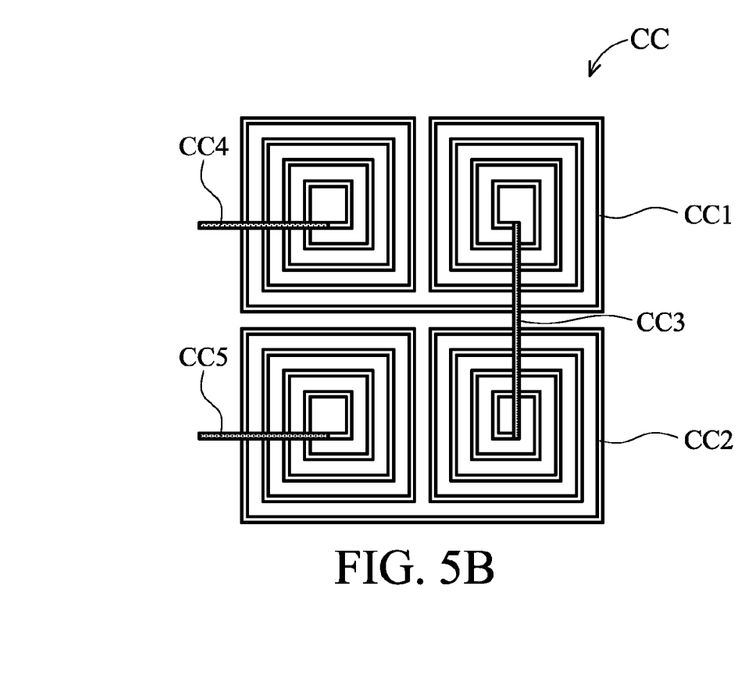

FIG. 5 shows two-layer metal wiring bead embodiments C and CC. The metal wiring bead C has a convoluted wiring pattern that has two convoluted segments C1 and C2 formed from the M1 conducting material in the first wiring layer 122 that are electrically connected in series by the connecting segment C3 that is formed from the M2 metal in the second metal wiring layer 124. Two terminal segments C4 and C5 provide the electrical connection to the functional power lines for the IC package. The terminal segments C4 and C5 are also formed from the M2 conducting material in the second metal wiring layer 124. Corresponding via structures (not shown) in the via layer 123 connects the convoluted segments C1 and C2 to the segments C3, C4 and C5.

The metal wiring bead CC has a convoluted wiring pattern that has two convoluted segments CC1 and CC2 formed from the M2 conducting material in the second wiring layer 124 that are connected in series by the connecting segment CC3 that is formed from the M1 conducting material in the first metal wiring layer 121. Two terminal segments CC4 and CC5 provide the electrical connection to the functional power lines for the IC package. The terminal segments CC4 and CC5 are also formed from the M1 conducting material in the first metal wiring layer 122. Corresponding via structures (not shown) in the via layer 123 connects the convoluted segments CC1 and CC2 to the segments CC3, CC4 and CC5. Because FIG. 4 is a plan view of the metal wiring beads C and CC, the via structures connecting the M1 conducting material structures with the M2 conducting material structures would be oriented orthogonal to the plane of the drawings and hidden between the connecting parts of the M1 and M2 conducting material structures.

Figure 6A:
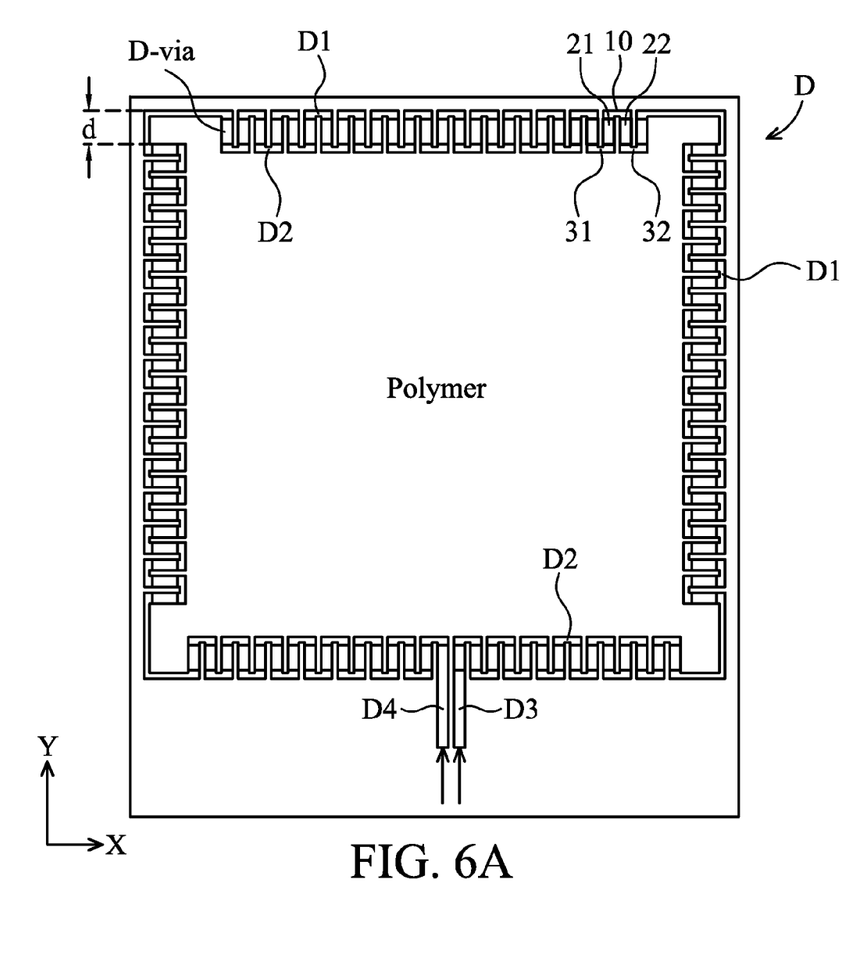
FIGS. 6A and 6B show a two-layer metal wiring bead according to another embodiment.
Figure 6B:
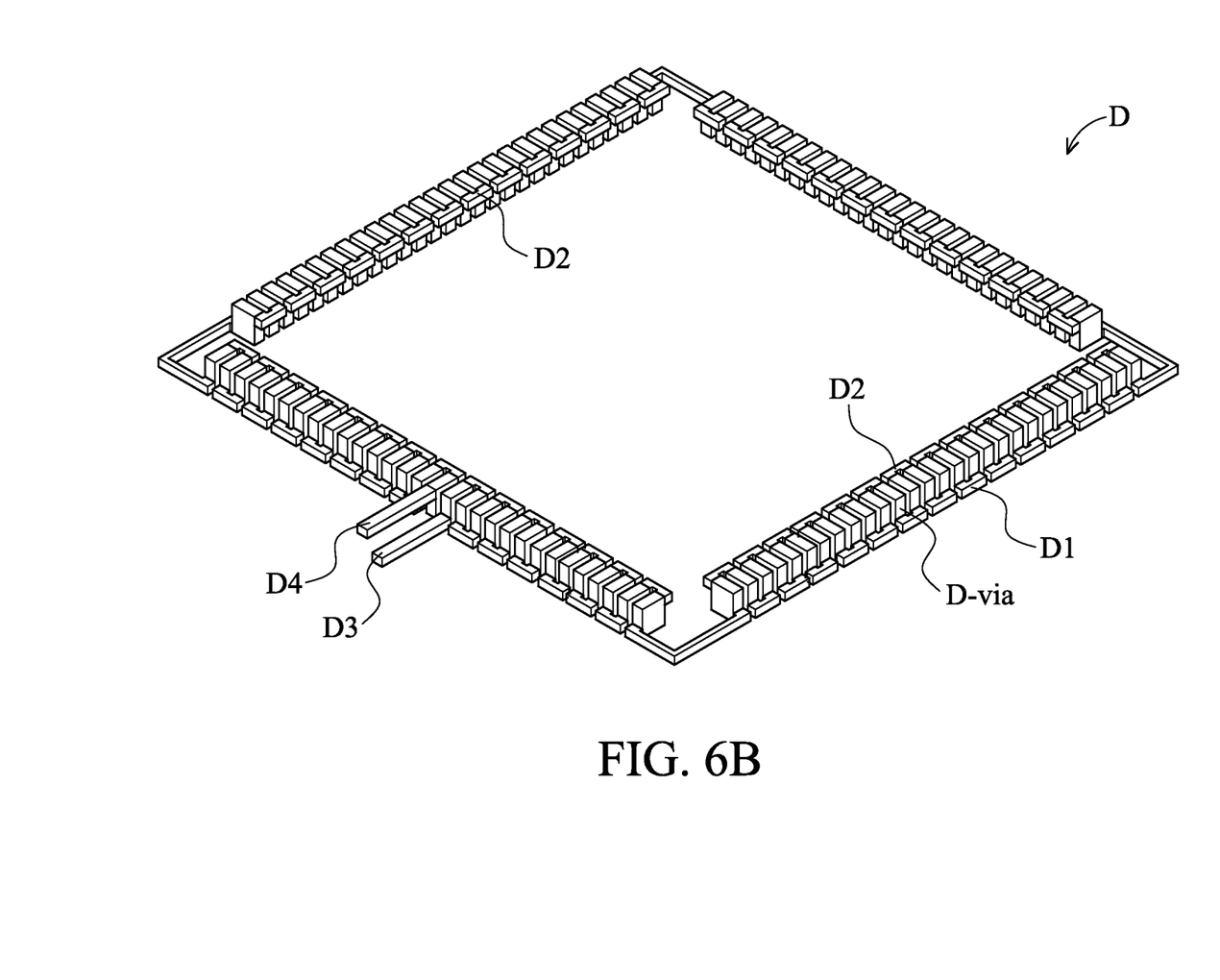

FIGS. 6A and 6B show another two-layer metal wiring bead embodiment D. The metal wiring bead D has a convoluted wiring pattern having a quadrilateral outline that has a first set of a plurality of line segments D1 formed from the M1 conducting material in the first wiring layer 122 and a second set of a plurality of line segments D2 formed from the M2 conducting material in the second wiring layer 124. A plurality of vias D-via in the via layer 123 provide the electrical connection between the first set of line segments D1 and the second set of line segments D2 and form a serpentine-like convoluted pattern for the metal wiring bead D. The first set of line segments D1 and the second set of line segments D2 are in a staggered arrangement as shown and the vias D-via connect each of the line segments in the first set D1 and the second set D2 to two line segments in the other set. For example, referring to FIG. 6A, the line segment 10 in the first set D1 is connected to two of the line segments 31 and 32 in the second set D2 by the vias 21 and 22. The same is true for the line segment 12 located at the corner of the square-shaped outline of the metal wiring bead D. The only difference is that the line segment 12 has a bend in the middle of the segment to form the corner section of the metal wiring bead D. The vias D-via are configured to extend not only in the Z-direction (i.e., the direction orthogonal to the plane of the wiring layers) but also extend along the direction parallel to the plane of the wiring layers. In the illustrated example of vias 21 and 22, they extend along Y-direction for a distance of d to make the connection between the line segment 10 and the line segments 31 and 32. Two terminal segments D3 and D4 provide the electrical connection to the functional power lines for the IC package. The terminal segment D3 is formed from the M1 conducting material in the first wiring layer 122 and the terminal segment D4 is formed from the M2 conducting material in the second wiring layer 124. FIG. 5B shows an isometric view illustration of the metal wiring bead D.

Figure 7A:
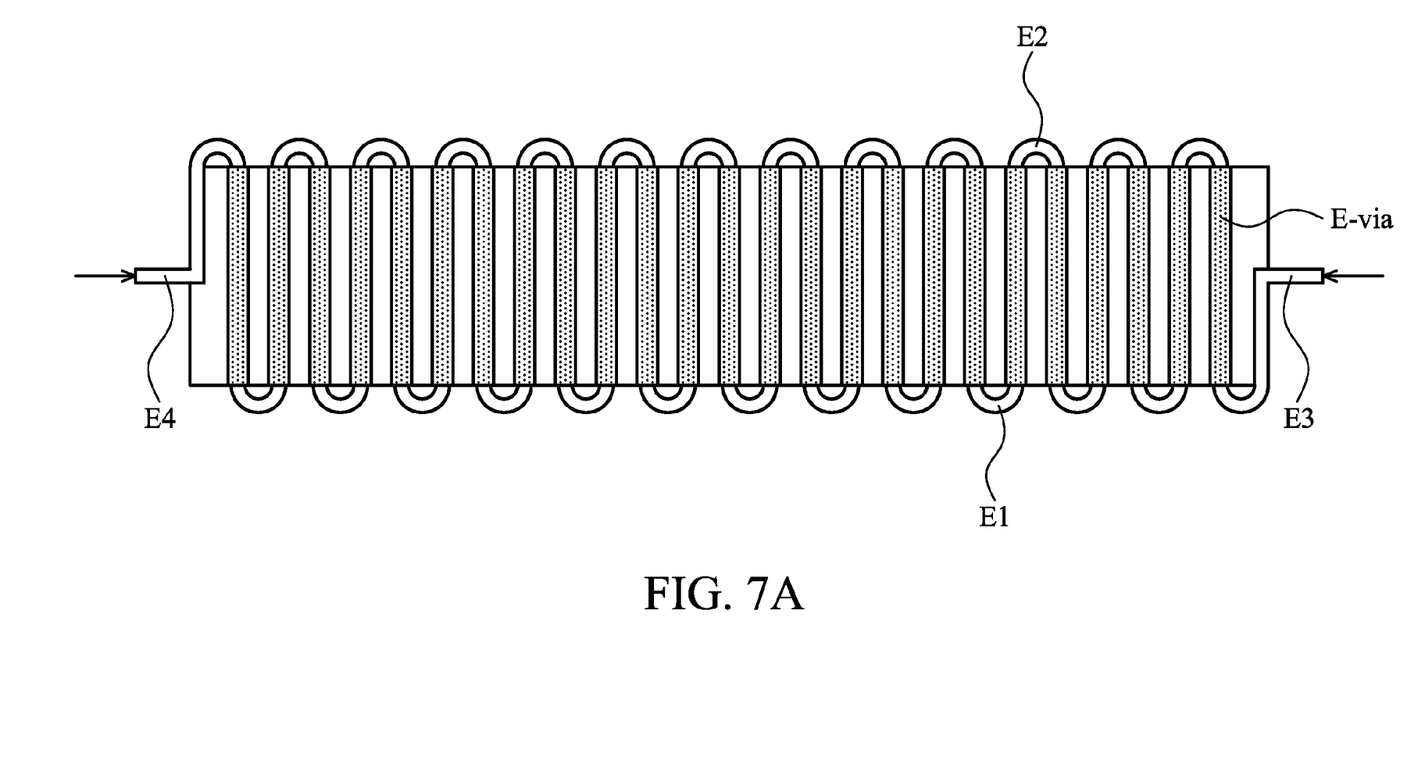
FIGS. 7A and 7B show a two-layer metal wiring bead according to another embodiment.
Figure 7B:
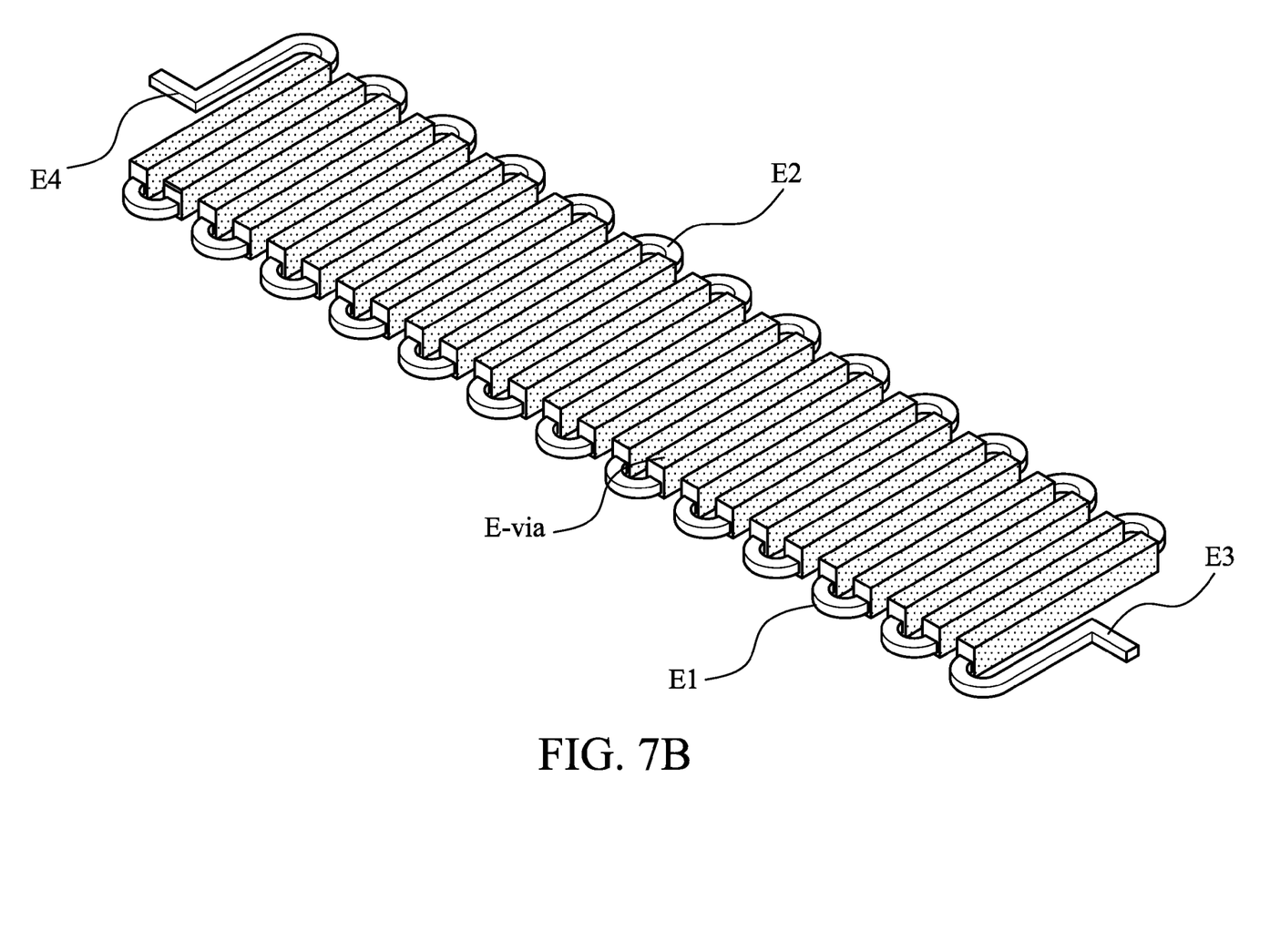

FIGS. 7A and 7B show another two-layer metal wiring bead embodiment E. The metal wiring bead E has a convoluted wiring pattern that forms a serpentine-like that has a first set of a plurality of line segments E1 formed from the M1 conducting material in the first wiring layer 122 and a second set of a plurality of line segments E2 formed from the M2 conducting material in the second wiring layer 124. A plurality of vias E-via in the via layer 123 provide the electrical connection between the first set of line segments E1 and the second set of line segments E2 and form a serpentine-like convoluted pattern for the metal wiring bead E. The vias E-via extend at least 100 µm along the X or Y direction within the via layer (i.e. the directions parallel to the plane of the wiring layers), thereby comprising a substantial portion of the total length of the metal wiring bead E. In one embodiment, the extended vias comprise at least 50% of the total length of the metal wiring bead E. The first and second sets of line segments E1 and E2 have a curved configuration rather than being straight line segments. Two terminal segments E3 and E4 provide the electrical connection to the functional power lines for the IC package.

Figure 8:
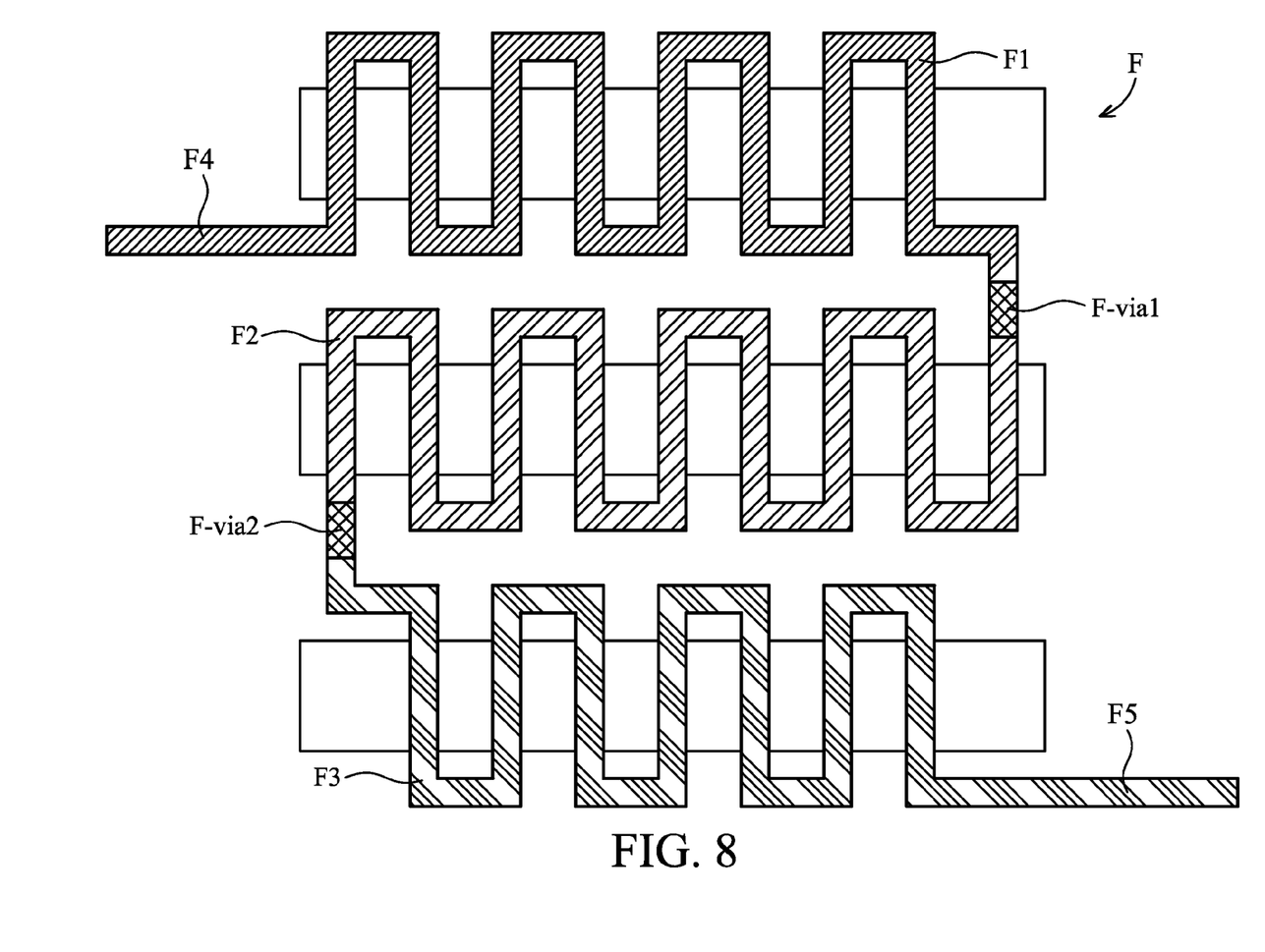
FIG. 8 shows a three-layer metal wiring bead according to an embodiment.

FIG. 8 shows a three-layer metal wiring bead embodiment F according to an aspect of the present disclosure. The metal wiring bead F comprises a convoluted wiring pattern that forms a serpentine-like structure in each of the three wiring layers 122, 124, and 126 that are electrically connected in series. In the first wiring layer 122, a first serpentine-like portion F1 is formed from the M1 conductor material. In the second wiring layer 124, a second serpentine-like portion F2 is formed from the M2 conductor material. In the third wiring layer 126, a third serpentine-like portion F3 is formed from the M3 conductor material. The electrical connection between the first serpentine-like portion F1 and the second serpentine-like portion F2 is provided by a via F-vial provided in the via layer 123. The electrical connection between the second serpentine-like portion F2 and the third serpentine-like portion F3 is provided by a via F-via2 provided in the via layer 125. Two terminal segments F4 and F5 provide the electrical connection to the functional power lines for the IC package.

Figure 9:
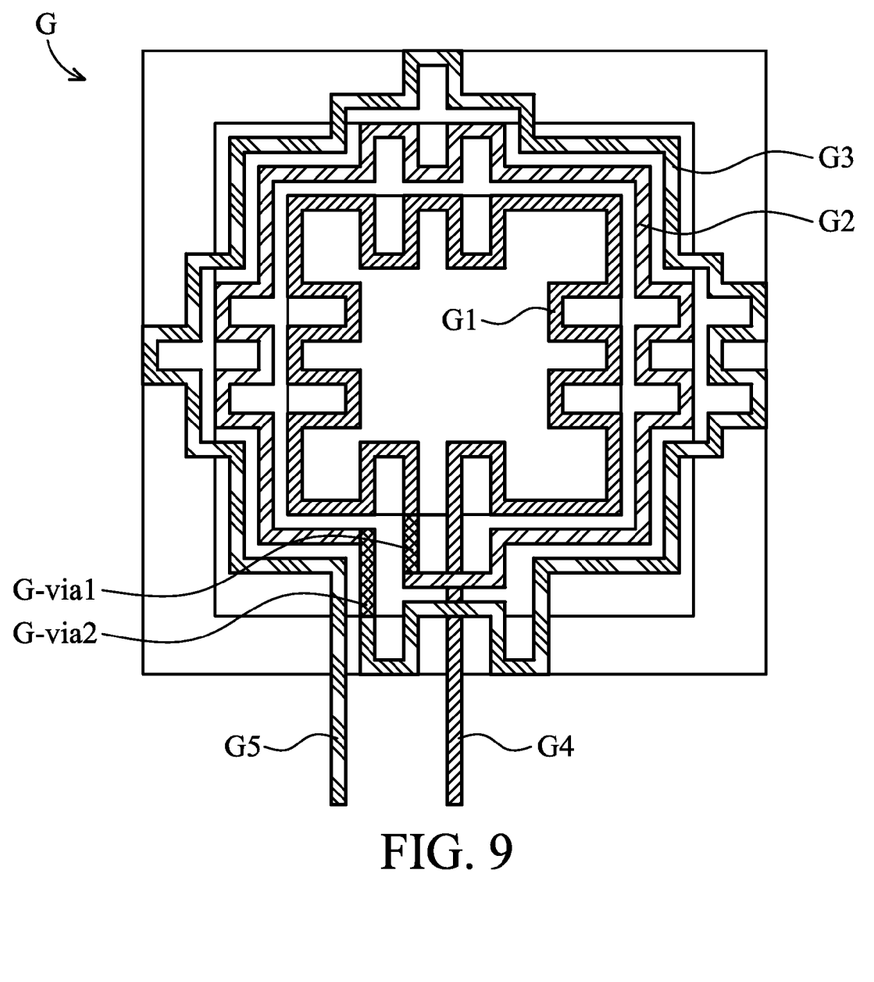
FIG. 9 shows another three-layer metal wiring bead according to another embodiment.

FIG. 9 shows another three-layer metal wiring bead embodiment G according to another aspect of the present disclosure. The metal wiring bead G comprises a convoluted wiring pattern in each of the three wiring layers 122, 124, and 126 that are electrically connected in series. In the first wiring layer 122, a first convoluted wiring pattern G1 is formed from the M1 conductor material. In the second wiring layer 124, a second convoluted wiring pattern G2 informed from the M2 conductor material. In the third wiring layer 126, a third convoluted wiring pattern G3 is formed from the M3 conductor material. The electrical connection between the first convoluted wiring pattern G1 and the second convoluted wiring pattern G2 is provided by a via G-vial provided in the via layer 123. The electrical connection between the second convoluted wiring pattern G2 and the third convoluted wiring pattern G3 is provided by a via G-via2 provided in the via layer 125. Two terminal segments G4 and G5 provide the electrical connection to the functional power lines for the IC package. As shown, the three convoluted wiring patterns G1, G2, and G3 have different size outlines, the first convoluted wiring pattern G1 having the smallest outline and the third convoluted wiring pattern G3 having the largest so that the second and the first convoluted wiring patterns G2 and G1 are nested within the outline of the third convoluted wiring pattern G3 when viewed from the top as shown in FIG. 8. This configuration is another example that provides sufficient metal length for the metal wiring bead G which will provide proper R (resistance) and XL (reactance) values for the bead.

Figure 10:
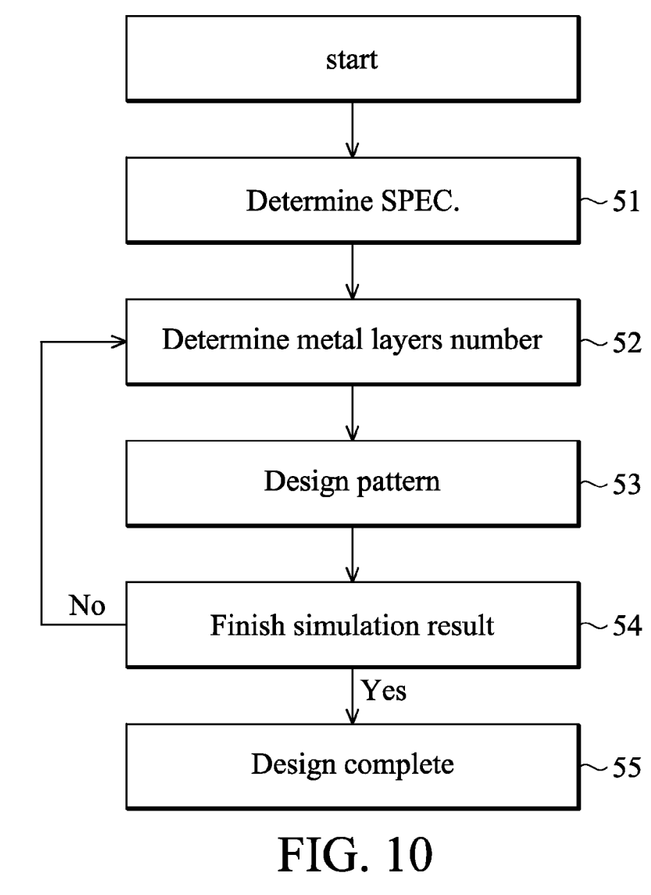
FIG. 10 is a flow chart for a method for providing the metal wiring bead according to an embodiment.

FIG. 10 shows a flow chart of a method for providing the metal wiring bead according to an embodiment. First, based on a performance requirement defined for a particular IC package, the necessary impedance specification for the metal wiring bead is determined. (See box 51). This is referred to herein as the desired impedance value. Then, a determination is made as to whether one, two or three layers of metal should be used to make the metal wiring bead for the particular IC package that will produce the necessary impedance. (See box 52). One determines whether one, two or three layers of metal should be used depending on the metal wiring bead impedance value that is necessary in a given application. Next, a determination is made as to the wiring pattern (e.g. a square, circle, etc.) of the metal wiring bead for the particular IC package that will produce the necessary impedance. (See box 53). The particular wiring pattern is chosen that would provide the desired wiring bead impedance value. Before the design for the metal wiring bead is finalized and implemented into the manufacturing process for the interposer for the IC package, a computer simulation is conducted to verify whether the specified impedance is met by the determined number of metal layers and the wiring pattern for the metal wiring bead. (See box 54).

If the results of the simulation shows that the desired impedance value is not achieved by the particular metal wiring bead design parameters, then the steps identified in the boxes 52, 53 and 54 are repeated until a metal wiring bead design parameters with the desired impedance value is achieved. If the results of the simulation shows that the desired impedance value is achieved by the particular metal wiring bead design parameters, the simulation is complete and the, design parameters can be incorporated into the manufacturing design data for the interposer for a 2.5D/3D IC package.

Figure 11:
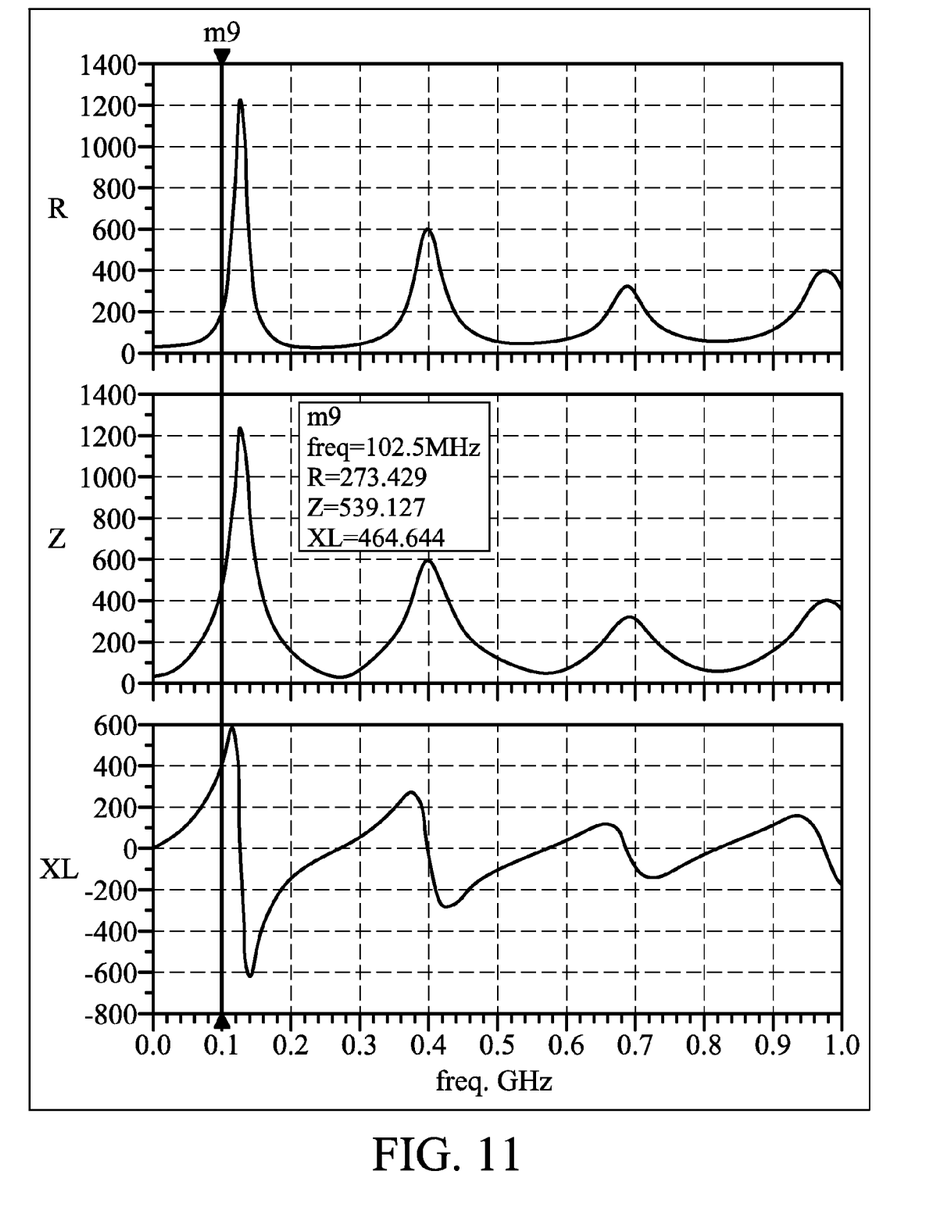
FIG. 11 shows plots of R, XL, Z performance values from a simulation of a metal wiring bead according to the present disclosure.
Figure 12A:
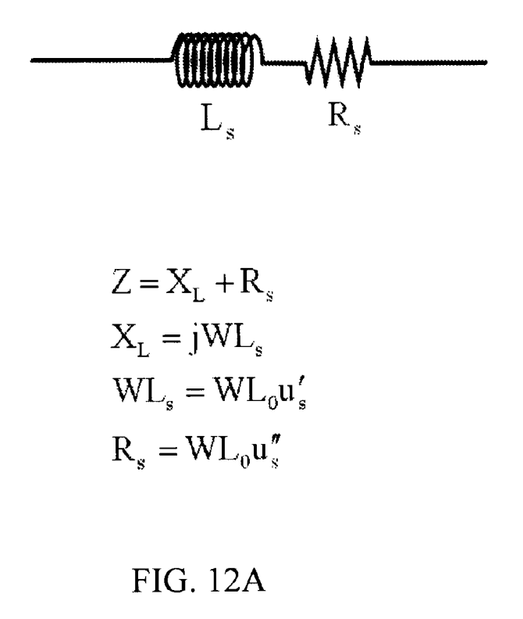
FIGS. 12A and 12B illustrate the relationship between the parameters Z, R, and $X_L$ (impendence, resistance, and reactande).
Figure 12B:
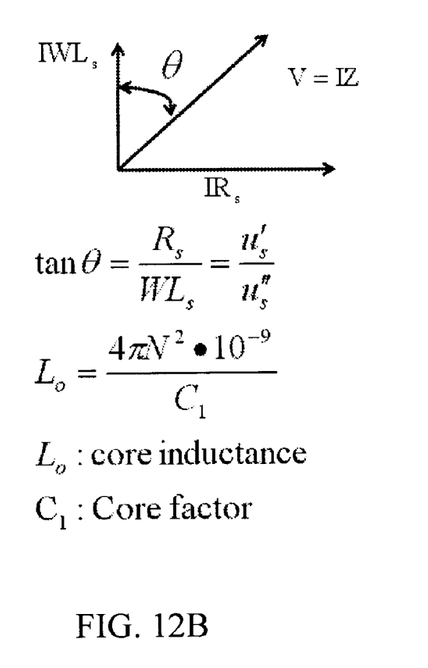

FIG. 11 shows plots of Z, R, and XL (impedance, resistance, and reactance) values at 102.5 MHz from a simulation of a metal wiring bead according to the present disclosure. The general relationship between the parameters Z, R; and XL used for such simulation calculations is well known in the art and is represented by the illustrations in FIGS. 12A and 12B:

The bead element of the present disclosure can be employed in IC packages and in particular, to a multilayer interposer structure for 2.5D/3D multi-chip packaging technologies to eliminate or substantially reduce different power noise and suppress electromagnetic interference in communication system applications.

Although the subject matter has been described in terms of exemplary embodiments, it is not limited thereto. Rather, the appended claims should be construed broadly, to include other variants and embodiments, which may be made by those skilled in the art.

What is claimed is:
1. An integrated circuit package comprising:
a multilayer interposer having one or more integrated devices mounted thereon, the interposer comprising multiple layers of wiring structures; and
one or more metal wiring beads provided in the interposer, each of the one or more metal wiring beads comprising:
a convoluted wiring pattern that is formed in one of the multiple layers of wiring structures in the interposer; and
two terminal end segments connected to power lines in the integrated circuit package, wherein the one or more metal wiring beads operate as power noise filters,
wherein the convoluted wiring pattern further comprises a plurality of vias, provided in a via layer between each of the multiple layers of wiring structures, establishing electrical connection between the layers of wiring structures.

2. The integrated circuit package of claim 1, wherein the convoluted wiring pattern comprises a serpentine-like portion between the two terminal end segments.

3. The integrated circuit package of claim 1, wherein the convoluted wiring pattern comprises a meandering loop portion between the two terminal end segments.

4. The integrated circuit package of claim 1, wherein the plurality of vias in the via layer between the first and second wiring layers connecting the first set of the plurality of line segments and the second set of the plurality of line segments extend at least 100 μm along a X or Y direction within the via layer, thereby forming a serpentine-like convoluted pattern and comprising a substantial portion of the total length of the metal wiring bead.

5. The integrated circuit package of claim 4, wherein the plurality of vias comprise at least 50% of the total length of the metal wiring bead.

6. The integrated circuit package of claim 1, wherein the convoluted wiring pattern comprises a first convoluted wiring pattern formed in the first of the multiple layers of wiring structures;
a second convoluted wiring pattern formed in the second of the multiple layers of wiring structures;
a third convoluted wiring pattern formed in the third of the multiple layers of wiring structures; and
wherein the three convoluted wiring patterns are electrically connected in series by the plurality of vias;
wherein the three convoluted wiring patterns have different size outlines, the first convoluted wiring pattern having the smallest outline, the third convoluted wiring pattern having the largest outline, thereby the first and second convoluted wiring pattern are nested within the outline of the third convoluted wiring pattern.

7. The integrated circuit package of claim 6, wherein a first via provided in a via layer between the first of the multiple layers of wiring structures and the second of the multiple layers of wiring structures establish the electrical connection between the first and second convoluted wiring patterns; and a second via provided in a via layer between the second of the multiple layers of wiring structures and the third of the multiple layers of wiring structures, establish the electrical connections between the second and third convoluted wiring patterns.

8. The integrated circuit package of claim 1, wherein the convoluted wiring pattern comprises a first set of a plurality of line segments provided in said one of the multiple layers of wiring structures; and the integrated circuit package further comprising a second convoluted wiring pattern formed in a second one of the multiple layers of wiring structures in the interposer, wherein the second convoluted wiring pattern comprises a second set of a plurality of line segments provided in a second of the multiple layers of wiring structures, wherein the first set of the plurality of line segments and the second set of the plurality of line segments are in a staggered arrangement; and the plurality of vias in the via layer between the first and second layers of wiring structures connecting the first set of the plurality of line segments and the second set of the plurality of line segments.

9. The integrated circuit package of claim 8, wherein the plurality of vias in the via layer between the first and second wiring layers connecting the first set of the plurality of line segments and the second set of the plurality of line segments extend at least 100 μm along a X or Y direction within the via layer, thereby forming a serpentine-like convoluted pattern and comprising a substantial portion of the total length of the metal wiring bead.

10. The integrated circuit package of claim 9, wherein the plurality of vias comprise at least 50% of the total length of the metal wiring bead.

11. The integrated circuit package of claim 8, wherein the convoluted wiring patterns comprise a serpentine-like portion between the two terminal end segments.

12. The integrated circuit package of claim 8, wherein the convoluted wiring patterns comprise a meandering loop portion between the two terminal end segments.

13. An integrated circuit package comprising:
a multilayer interposer having one or more integrated devices mounted thereon, the interposer comprising multiple layers of wiring structures; and
one or more metal wiring beads provided in the interposer, each of the one or more metal wiring beads comprising:
a convoluted wiring pattern formed in each of at least three of the multiple layers of wiring structures in the interposer; and
two terminal end segments connected to power lines in the integrated circuit package, wherein the one or more metal wiring beads operate as power noise filters,
wherein the convoluted wiring pattern formed in the first of the at least three of the multiple layers of wiring structures comprises a first serpentine-like segment;
the convoluted wiring pattern formed in the second of the at least three of the multiple layers of wiring structures comprises a second serpentine-like segment;
the convoluted wiring pattern formed in the third of the at least three of the multiple layers of wiring structures comprises a third serpentine-like segment; and
wherein the three serpentine-like segments are electrically connected in series.

14. The integrated circuit package of claim 13, wherein the first and second serpentine-like segments are connected by a via provided in the via layer between the first and second of the multiple layers of wiring structures, and the second and third serpentine-like segments are connected by a via provided in the via layer between the first and second of the multiple layers of wiring structures.

15. An integrated circuit package comprising:
a multilayer interposer having one or more integrated devices mounted thereon, the interposer comprising multiple layers of wiring structures; and
one or more metal wiring beads provided in the interposer, each of the one or more metal wiring beads comprising:
a convoluted wiring pattern that is formed in one of the multiple layers of wiring structures in the interposer; and
two terminal end segments connected to power lines in the integrated circuit package, wherein the one or more metal wiring beads operate as power noise filters,
wherein the convoluted wiring pattern comprises two convoluted segments formed in one of the multiple layers of wiring structures in the interposer and the two convoluted segments are electrically connected in series by a connecting segment formed in a second one of the multiple layers of wiring structures in the interposer, wherein vias, provided in a via layer between the one of the multiple layers of wiring structures and the second one of the multiple layers of wiring structures, establish the electrical connection between the two convoluted segments.

16. The integrated circuit package of claim 15, wherein the convoluted wiring pattern comprises a serpentine-like portion between the two terminal end segments.

17. The integrated circuit package of claim 15, wherein the convoluted wiring pattern comprises a meandering loop portion between the two terminal end segments.

* * * * *